United States Patent
Hirayama et al.

(10) Patent No.: US 12,258,468 B2
(45) Date of Patent: Mar. 25, 2025

(54) THERMOSETTING RESIN COMPOSITION, PREPREG, RESIN-COATED METAL FOIL, LAMINATE, PRINTED WIRING BOARD, AND SEMICONDUCTOR PACKAGE

(71) Applicant: HITACHI CHEMICAL COMPANY, LTD., Tokyo (JP)

(72) Inventors: Yuya Hirayama, Tokyo (JP); Keisuke Kushida, Tokyo (JP); Kenichi Tomioka, Tokyo (JP); Hiroshi Shimizu, Tokyo (JP)

(73) Assignee: Resonac Corporation, Tokyo (JP)

( * ) Notice: Subject to any disclaimer, the term of this patent is extended or adjusted under 35 U.S.C. 154(b) by 0 days.

(21) Appl. No.: 17/043,357

(22) PCT Filed: Mar. 29, 2019

(86) PCT No.: PCT/JP2019/014141
§ 371 (c)(1),
(2) Date: Sep. 29, 2020

(87) PCT Pub. No.: WO2019/189811
PCT Pub. Date: Oct. 3, 2019

(65) Prior Publication Data
US 2021/0024741 A1    Jan. 28, 2021

(30) Foreign Application Priority Data

Mar. 30, 2018    (WO) ................. PCT/JP2018/013930

(51) Int. Cl.
| | | |
|---|---|---|
| *C08L 61/06* | (2006.01) | |
| *B32B 15/098* | (2006.01) | |
| *C08J 5/24* | (2006.01) | |
| *C08L 63/00* | (2006.01) | |
| *H05K 1/05* | (2006.01) | |

(52) U.S. Cl.
CPC ............ *C08L 61/06* (2013.01); *B32B 15/098* (2013.01); *C08J 5/244* (2021.05); *C08J 5/249* (2021.05); *C08L 63/00* (2013.01); *H05K 1/056* (2013.01); *B32B 2305/076* (2013.01); *B32B 2307/738* (2013.01); *B32B 2363/00* (2013.01)

(58) Field of Classification Search
CPC ........ C08L 61/06; C08L 63/00; B32B 15/098; B32B 2305/076; B32B 2307/738; B32B 2363/00; B32B 2250/05; B32B 5/26; B32B 15/043; B32B 2250/40; B32B 2255/06; B32B 2260/021; B32B 2262/062; B32B 2262/101; B32B 2262/14; B32B 2264/102; B32B 2307/206; B32B 19/041; B32B 2260/046; B32B 2264/10; B32B 5/022; B32B 2262/0253; B32B 15/14; B32B 2255/26; B32B 2262/10; B32B 2262/106; B32B 2307/306; B32B 2307/51; B32B 2307/732; B32B 2457/08; B32B 5/024; B32B 5/08; B32B 7/02; B32B 15/20; B32B 19/06; B32B 15/08; C08J 5/24; C08J 2363/00; C08J 2461/06; C08J 5/244; H05K 1/056; H05K 3/022; H05K 1/0366; H05K 1/03; C08G 8/08; C08G 8/10; H01L 23/145; H01L 23/14
USPC ........................................................ 428/461
See application file for complete search history.

(56) References Cited

U.S. PATENT DOCUMENTS

| | | | | |
|---|---|---|---|---|
| 2004/0054119 A1* | 3/2004 | Hayakawa | ............ | H01L 23/293 528/219 |
| 2010/0129045 A1* | 5/2010 | Shibata | ...................... | C09J 7/35 522/170 |
| 2010/0294548 A1* | 11/2010 | Fujisawa | .................. | B32B 27/04 174/258 |
| 2011/0244183 A1* | 10/2011 | Goto | ......................... | B32B 7/12 428/145 |

(Continued)

FOREIGN PATENT DOCUMENTS

| | | |
|---|---|---|
| CN | 103772632 A | 5/2014 |
| JP | 8-283535 A | 10/1996 |

(Continued)

OTHER PUBLICATIONS

Machine translation of JP 2015-089940 A (Year: 2015).*

(Continued)

*Primary Examiner* — Callie E Shosho
*Assistant Examiner* — Steven A Rice
(74) *Attorney, Agent, or Firm* — FITCH, EVEN, TABIN & FLANNERY, LLP

(57) ABSTRACT

To provide a thermosetting resin composition that has low elasticity, high heat resistance, high elongation under an ordinary temperature environment and a high temperature environment, high electric insulation reliability, and high adhesion strength to a metal foil, and is capable of providing a prepreg that is excellent in crack resistance; a prepreg including the thermosetting resin composition; a metal foil with a resin including the thermosetting resin composition and a metal foil laminated on each other; a laminate including the prepreg or the metal foil with a resin; a printed wiring board including the laminate; and a semiconductor package including the printed wiring board. Specifically, the thermosetting resin composition contains (A) a phenol-based resin, and the component (A) contains (A-1) a phenol-based resin having an aliphatic hydrocarbon group having 10 to 25 carbon atoms.

9 Claims, No Drawings

(56) References Cited

U.S. PATENT DOCUMENTS

| | | | | |
|---|---|---|---|---|
| 2011/0256666 | A1* | 10/2011 | Sugo | H01L 21/6836 438/113 |
| 2013/0108861 | A1* | 5/2013 | Yokota | B32B 27/38 428/331 |
| 2013/0109785 | A1* | 5/2013 | Endo | H05K 7/02 523/436 |
| 2013/0281559 | A1* | 10/2013 | Park | H01L 24/73 521/135 |
| 2015/0322193 | A1 | 11/2015 | Banach et al. | |
| 2016/0017141 | A1 | 1/2016 | Matsumoto et al. | |
| 2017/0218150 | A1 | 8/2017 | Matsumoto et al. | |
| 2019/0181113 | A1* | 6/2019 | Morita | C09J 163/00 |
| 2019/0309184 | A1* | 10/2019 | Oishi | H01L 23/293 |
| 2020/0231786 | A1* | 7/2020 | Sakauchi | H01L 21/6835 |
| 2020/0413542 | A1* | 12/2020 | Ooyama | H05K 1/09 |

FOREIGN PATENT DOCUMENTS

| | | |
|---|---|---|
| JP | 2002-134907 A | 5/2002 |
| JP | 2002-371190 A | 12/2002 |
| JP | 2014-193994 A | 10/2014 |
| JP | 2015-089940 A | 5/2015 |
| JP | 2016-047921 A | 4/2016 |
| JP | 2016069567 A * | 5/2016 |
| JP | 2017-110198 A | 6/2017 |
| JP | 2017-515941 A | 6/2017 |
| JP | 2018-012792 A | 1/2018 |
| KR | 10-2014-0113665 A | 9/2014 |

OTHER PUBLICATIONS

Machine translation of JP 2017-110198 A (Year: 2017).*
Machine translation of JP 2016-069567 A (Year: 2016).*
Nguyen, Thi et al., Development of Sustainable Thermosets from Cardanol-based Epoxy Prepolymer and Ionic Liquids, ACS Sustainable & Engineering, vol. 5. No. 9, Aug. 14, 2017, pp. 8429-8438, XP55844661 (cited in an Supplementary European Search Report dated Oct. 11, 2021 in corresponding EP Appln. No. 19775595. 2).

* cited by examiner

THERMOSETTING RESIN COMPOSITION, PREPREG, RESIN-COATED METAL FOIL, LAMINATE, PRINTED WIRING BOARD, AND SEMICONDUCTOR PACKAGE

CROSS-REFERENCE TO RELATED APPLICATIONS

This application is a U.S. national phase application filed under 35 U.S.C. § 371 of International Application No. PCT/JP2019/014141, filed Mar. 29, 2019, designating the United States, which claims priority from International Application No. PCT/JP2018/013930, filed Mar. 30, 2018, which are hereby incorporated herein by reference in their entirety.

TECHNICAL FIELD

The present invention relates to a thermosetting resin composition, a prepreg, a metal foil with a resin, a laminate, a printed wiring board, and a semiconductor package.

BACKGROUND ART

Personal equipments used in daily life are being computerized from the standpoint of the enhancement of convenience, efficiency, and energy saving, and electronic components used in the electronic equipments are being demanded to have a reduced weight and a reduced size from the standpoint of the enhancement of convenience in use and the like. Under the circumstances, a printed wiring board mounted therein is also highly demanded to have an increased density and an enhanced function.

The increase of the density of the printed wiring board can be further favorably achieved by reducing the thickness of a glass cloth as a base material (for example to a thickness of 30 μm or less), and therefore a prepreg having such a thin glass cloth has been developed and marketed in recent years. The increase of the density of the printed wiring board is further proceeding thereby, which however is accompanied by difficulty in sufficiently securing the heat resistance, the electric insulation reliability, the adhesiveness between the wiring layer and the insulating layer, and the like in the printed wiring board.

A material for a wiring board used in a highly functional printed wiring board is demanded to have the heat resistance, the electric insulation reliability, the long-term reliability, the adhesiveness between the wiring layer and the insulating layer, and the like. Furthermore, a material for a flexible wiring board, which is one example of the highly functional printed wiring board, is demanded to have such characteristics as low elasticity and flexibility, in addition to the aforementioned characteristics.

A substrate having a ceramic component mounted thereon has an important problem of decrease in reliability of the connection of the component, which is caused by the difference in thermal expansion coefficient between the ceramic component and the substrate, and an external impact. As a solution for the problem, the stress relaxation from the base material has been proposed.

For solving the problems, a resin composition containing a thermosetting resin and a thermoplastic resin, such as an acrylic resin and a terminal modified polyethersulfone, has been proposed (see, for example, PTLs 1 to 5).

CITATION LIST

Patent Literatures

PTL 1: JP 8-283535 A
PTL 2: JP 2002-134907 A
PTL 3: JP 2002-371190 A
PTL 4: JP 2014-193994 A
PTL 5: JP 2016-047921 A

SUMMARY OF INVENTION

Technical Problem

However, the resin composition containing a thermoplastic resin can secure the low elasticity, the high heat resistance, and the high elongation, but has a problem of difficulty in securing the sufficiently excellent adhesion strength to a metal foil due to the low mechanical strength, which is peculiar to a thermoplastic resin.

In recent years, a printed wiring board is being frequently applied to a severe environment, such as a high temperature environment, and the further investigation by the present inventors has revealed that it is difficult for the printed wiring board of the related art to suppress the occurrence of cracks under a severe environment, and to secure the adhesion strength to a metal foil under a severe environment.

The present invention has been made in view of the circumstances, and a problem to be solved thereby is to provide: a thermosetting resin composition that has low elasticity, high heat resistance, high elongation under an ordinary temperature environment and a high temperature environment, high electric insulation reliability, and high adhesion strength to a metal foil, and is capable of providing a prepreg that is excellent in crack resistance; a prepreg including the thermosetting resin composition; a metal foil with a resin including the thermosetting resin composition and a metal foil laminated on each other; a laminate including the prepreg or the metal foil with a resin; a printed wiring board including the laminate; and a semiconductor package including the printed wiring board.

Solution to Problem

As a result of the earnest investigations for solving the problem by the present inventors, it has been found the problem can be solved by a thermosetting resin composition containing a phenol-based resin having an aliphatic hydrocarbon group having a particular number of carbon atoms, and thus the present invention has been completed. The present invention has been completed based on the knowledge.

The present invention relates to the following items [1] to [15].

[1] A thermosetting resin composition containing (A) a phenol-based resin,
the component (A) containing (A-1) a phenol-based resin having an aliphatic hydrocarbon group having 10 to 25 carbon atoms.

[2] The thermosetting resin composition according to the item [1], wherein the component (A-1) has at least one kind of a structural unit selected from the group consisting of a structural unit (a1) represented by the following general formula (a1) and a structural unit (a2) represented by the following general formula (a2):

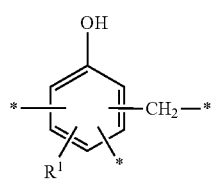

(a1)

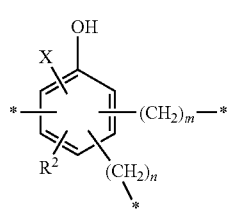

(a2)

wherein $R^1$ represents a hydrogen atom, an aliphatic hydrocarbon group having 1 to 9 carbon atoms, which optionally have a substituent, an aromatic hydrocarbon group having 5 to 15 ring atoms, which optionally have a substituent, or a combination of the aliphatic hydrocarbon group and the aromatic hydrocarbon group; $R^2$ represents an aliphatic hydrocarbon group having 10 to 25 carbon atoms; X represents a hydrogen atom, a hydroxy group, or a hydroxymethyl group; and m and n each independently represent 0 or 1.

- [3] The thermosetting resin composition according to the item [2], wherein a molar ratio of the structural unit (a1) with respect to the structural unit (a2) (structural unit (a1)/structural unit (a2)) is from 0 to 5.0.
- [4] The thermosetting resin composition according to any one of the items [1] to [3], wherein the component (A-1) has a weight average molecular weight (Mw) of 4,000 or less.
- [5] The thermosetting resin composition according to any one of the items [1] to [4], wherein the component (A-1) has a hydroxy group equivalent of 90 to 350 g/eq.
- [6] The thermosetting resin composition according to any one of the items [1] to [5], wherein a content of the component (A-1) is from 0.1 to 40 parts by mass per 100 parts by mass of the total resin content of the thermosetting resin composition.
- [7] The thermosetting resin composition according to any one of the items [1] to [6], wherein the component (A) further contains (A-2) a phenol-based resin that does not have an aliphatic hydrocarbon group having 10 to 25 carbon atoms.
- [8] The thermosetting resin composition according to the item [7], wherein a content ratio of the component (A-1) is from 30 to 95% by mass based on the total amount of the component (A-1) and the component (A-2).
- [9] The thermosetting resin composition according to any one of the items [1] to [8], wherein the thermosetting resin composition further contains (B) a thermosetting resin.
- [10] The thermosetting resin composition according to the item [9], wherein the component (B) is at least one kind selected from the group consisting of an epoxy resin, a cyanate resin, a bismaleimide-based compound, an addition polymer of a bismaleimide-based compound and a diamine, an isocyanate resin, a triallyl isocyanurate resin, a triallyl cyanurate resin, and a vinyl group-containing polyolefin.
- [11] A prepreg including the thermosetting resin composition according to any one of the items [1] to [10].
- [12] A metal foil with a resin including the thermosetting resin composition according to any one of the items [1] to [10] and a metal foil laminated on each other.
- [13] A laminate including the prepreg according to the item [11] or the metal foil with a resin according to the item [12].
- [14] A printed wiring board including the laminate according to the item [13].
- [15] A semiconductor package including the printed wiring board according to the item [14].

Advantageous Effects of Invention

According to the present invention, a thermosetting resin composition that has low elasticity, high heat resistance, high elongation under an ordinary temperature environment and a high temperature environment, high electric insulation reliability, and high adhesion strength to a metal foil, and is capable of providing a prepreg that is excellent in crack resistance (particularly crack resistance under a severe environment); a prepreg including the thermosetting resin composition; a metal foil with a resin including the thermosetting resin composition and a metal foil laminated on each other; a laminate including the prepreg or the metal foil with a resin; a printed wiring board including the laminate; and a semiconductor package including the printed wiring board can be provided.

The thermosetting resin composition of the present invention can provide a prepreg having low tackiness.

DESCRIPTION OF EMBODIMENTS

An embodiment of the present invention will be described in detail below, but the present invention is not limited to the following embodiment.

In the numeral ranges shown in the description herein, the upper limit or the lower limit of the numeral range may be replaced by the value shown in the examples. The upper limit or the lower limit of the numeral range may be arbitrarily combined with the upper limit or the lower limit of another numeral range.

The components and materials exemplified in the description herein each may be used alone or as a combination of two or more kinds thereof unless otherwise indicated. In the description herein, in the case where plural substances correspond to the component exist in the composition, the content of the component in the composition means the total amount of the plural substances unless otherwise indicated.

In the case where an embodiment exemplified or described as being preferred is a group of options, an arbitrary number of arbitrary options may be selected from the group, and the selected options each may be arbitrarily combined with an embodiment described elsewhere.

An embodiment obtained by arbitrarily combining the items shown in the description herein is also encompassed in the present invention.

[Thermosetting Resin Composition]

The thermosetting resin composition of the present invention is:

a thermosetting resin composition containing (A) a phenol-based resin, and the component (A) contains (A-1) a phenol-based resin having an aliphatic hydrocarbon group having 10 to 25 carbon atoms.

The thermosetting resin composition of the present invention can achieve the low elasticity, the high heat resistance, the high elongation under an ordinary temperature environment and a high temperature environment (which may hereinafter referred simply to as the high elongation), the high crack resistance (particularly the high crack resistance under a severe environment), the high electric insulation reliability, and the high adhesion strength to a metal foil. This effect can be achieved mainly by the component (A-1) having the low elasticity contained, irrespective of the use of the thermosetting resin as the component (A). In particular, the low elasticity, irrespective of the high heat resistance and the high elongation, can suppress cracks that tend to occur in a printed wiring board under a severe environment, and in addition, can advantageously achieve the high electric insulation reliability and the high adhesion strength to a metal foil.

In particular, the excellent high elongation under a high temperature environment achieves the expression of the stress relaxation effect under a high temperature environment, and simultaneously achieves the expression of a sufficient restoration capability against the thermal expansion in the temperature change between an ordinary temperature environment (which means a temperature range of approximately from 15 to 45° C., which is hereinafter the same) and a high temperature environment (which means a temperature range of approximately from 80 to 160° C., which is hereinafter the same).

The thermosetting resin composition of the present invention having the aforementioned effects is a composition that is useful particularly for a prepreg, a laminate, a metal foil with a resin, and the like, used in a printed wiring board. Accordingly, the thermosetting resin composition of the present invention is also useful as a thermosetting resin composition for an interlayer insulating layer, more specifically as a thermosetting resin composition for an interlayer insulating layer of a printed wiring board or a thermosetting resin composition for an interlayer insulating layer of a flexible printed wiring board.

In the observation of the morphology of the cured product of the thermosetting resin composition of the present invention with a scanning electron microscope (SEM) at a magnification of approximately 2,000, the cured product forms no phase separation structure but appears uniform.

The components of the thermosetting resin composition of the present invention will be described below.

[(A): Phenol-Based Resin]

The phenol-based resin as the component (A) (which may be hereinafter referred to as a phenol-based resin (A)) contains (A-1) a phenol-based resin having an aliphatic hydrocarbon group having 10 to 25 carbon atoms (which may be hereinafter referred to as a phenol-based resin (A-1)). The phenol-based resin (A) provides the high adhesion strength to a metal foil while achieving the low elasticity, the high heat resistance, and the high elongation, due to the phenol-based resin (A-1) contained therein. The phenol-based resin (A-1) may be used alone or as a combination of two or more kinds thereof. The phenol-based resin (A) can generally function also as a curing agent for a thermosetting resin (B) described later, particularly as a curing agent for an epoxy resin.

The phenol-based resin (A-1) contained in the phenol-based resin (A) will be described in detail below.

((A-1): Phenol-Based Resin Having Aliphatic Hydrocarbon Group Having 10 to 25 Carbon Atoms)

The aliphatic hydrocarbon group having 10 to 25 carbon atoms contained in the phenol-based resin (A-1) may be any of chain-like (e.g., linear chain-like and branched chain-like), cyclic, and a combination of chain-like and cyclic, and is preferably chain-like or a combination of chain-like and cyclic, and it is more preferred that cyclic is contained, with a combination of chain-like and cyclic being further preferred, from the standpoint of the low elasticity and the low hygroscopicity. The "chain-like" may be any of linear chain-like and branched chain-like, and is more preferably linear chain-like. With the number of carbon atoms of the aliphatic hydrocarbon group contained in the phenol-based resin (A-1) of 10 or more, a cured product that has the low elasticity and the low hygroscopicity can be obtained, and with the number of carbon atoms of the aliphatic hydrocarbon group of 25 or less, the high heat resistance can be retained.

From the same standpoint, the aliphatic hydrocarbon group having 10 to 25 carbon atoms contained in the phenol-based resin (A-1) that is a chain-like aliphatic hydrocarbon group is preferably an aliphatic hydrocarbon group having 10 to 20 carbon atoms, more preferably an aliphatic hydrocarbon group having 12 to 20 carbon atoms, further preferably an aliphatic hydrocarbon group having 12 to 18 carbon atoms, still further preferably an aliphatic hydrocarbon group having 14 to 18 carbon atoms, and particularly preferably an aliphatic hydrocarbon group having 14 to 16 carbon atoms, and it is most preferred that the number of carbon atoms is 15. The aliphatic hydrocarbon group that is other than a chain-like group is preferably an aliphatic hydrocarbon group having 10 to 18 carbon atoms, more preferably an aliphatic hydrocarbon group having 10 to 15 carbon atoms, further preferably an aliphatic hydrocarbon group having 10 to 13 carbon atoms, particularly preferably an aliphatic hydrocarbon group having 10 to 12 carbon atoms, and most preferably an aliphatic hydrocarbon group having 11 carbon atoms.

Examples of the aliphatic hydrocarbon group include a saturated aliphatic hydrocarbon group having 10 to 25 carbon atoms and an unsaturated aliphatic hydrocarbon group having 10 to 25 carbon atoms. The saturated aliphatic hydrocarbon group and the unsaturated aliphatic hydrocarbon group each may be any of chain-like (e.g., linear chain-like and branched chain-like), cyclic, and a combination of chain-like and cyclic, and is preferably chain-like or a combination of chain-like and cyclic from the standpoint of the low elasticity and the low hygroscopicity. The chain-like group is preferably a linear chain-like group. The number of an unsaturated bond contained in the unsaturated aliphatic hydrocarbon group may be 1 or may be 2 or more, and generally may be 5 or less or may be 3 or less.

In view of the above, the aliphatic hydrocarbon group having 10 to 25 carbon atoms contained in the phenol-based resin (A-1) is preferably a chain-like aliphatic hydrocarbon group having 10 to 25 carbon atoms or an aliphatic hydrocarbon group having a combination of chain-like and cyclic from the standpoint of the low elasticity and the low hygroscopicity. In the aliphatic hydrocarbon group having a combination of chain-like and cyclic, the chain-like moiety is preferably a linear chain-like moiety having 4 or more carbon atoms, and more preferably a linear chain-like moiety having 5 or more carbon atoms, from the standpoint of the low elasticity. The mode of the combination of chain-like and cyclic is not particularly limited, and may be any of -chain-like-cyclic, -cyclic-chain-like, and -chain-like-cyclic-chain-like, and is preferably -cyclic-chain-like. Specific examples of the -cyclic-chain-like include a 4-pentylcyclohexyl group (C11), a 4-octylcyclohexyl group (C14), a 4-decylcyclohexyl group (C16), a 4-pentylcyclooctyl group (C13), and a 4-octylcyclooctyl group (C16). Among these, the -cyclic-chain-like is preferably a 4-pentylcyclohexyl group (C11).

The phenol-based resin (A-1) used is preferably a combination of a phenol-based resin having a saturated aliphatic hydrocarbon group having 10 to 25 carbon atoms and a phenol-based resin having an unsaturated aliphatic hydrocarbon group having 10 to 25 carbon atoms. In the combination use of the phenol-based resin having a saturated aliphatic hydrocarbon group having 10 to 25 carbon atoms and the phenol-based resin having an unsaturated aliphatic hydrocarbon group having 10 to 25 carbon atoms, the mass proportion of the phenol-based resin having an unsaturated aliphatic hydrocarbon group having 10 to 25 carbon atoms with respect to the total of both the resins may be 60% by mass or more, may be 80% by mass or more, and may be 90% by mass or more. The upper limit of the mass proportion thereof is not particularly limited, and may be 98% by mass or less. Examples of the phenol-based resin (A-1) of this embodiment include a phenol-based resin having a structural unit derived from cardanol.

In the phenol-based resin (A-1), the aliphatic hydrocarbon group having 10 to 25 carbon atoms is preferably substituted on the meta-position (i.e., the 3-position or the 5 position) with respect to the position where the hydroxy group of the phenol moiety is bonded (i.e., the 1-position).

Examples of the saturated aliphatic hydrocarbon group having 10 to 25 carbon atoms include various decyl groups (the term "various" means that all the linear chain-like, branched chain-like, and cyclic groups are encompassed, which is the same hereinafter), various undecyl group (for example, including a 4-pentylcyclohexyl group), various dodecyl groups, various tetradecyl groups, various pentadecyl groups, various hexadecyl groups, various octadecyl groups, and various eicosyl groups.

Examples of the unsaturated aliphatic hydrocarbon group having 10 to 25 carbon atoms include the aforementioned saturated aliphatic hydrocarbon group having 10 to 25 carbon atoms, in which at least a part thereof becomes a carbon-carbon unsaturated bond. Examples thereof having a number of carbon atoms of 15 include an 8-pentadecen-1-yl group, an 8,11-pentadecadien-1-yl group, and an 8,11,14-pentadecatrien-1-yl group.

The phenol-based resin (A-1) preferably has at least one kind of a structural unit selected from the group consisting of a structural unit (a1) represented by the following general formula (a1) and a structural unit (a2) represented by the following general formula (a2) from the standpoint of the low elasticity and the low hygroscopicity. It can be said that the phenol-based resin (A-1) has at least one of the structural unit (a2).

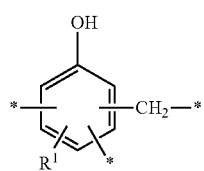

(a1)

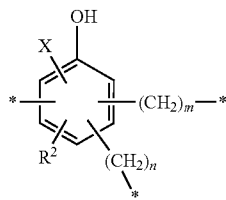

(a2)

In the general formulae, $R^1$ represents a hydrogen atom, an aliphatic hydrocarbon group having 1 to 9 carbon atoms, which optionally have a substituent, an aromatic hydrocarbon group having 5 to 15 ring atoms, which optionally have a substituent, or a combination of the aliphatic hydrocarbon group and the aromatic hydrocarbon group; $R^2$ represents an aliphatic hydrocarbon group having 10 to 25 carbon atoms; X represents a hydrogen atom, a hydroxy group, or a hydroxymethyl group; and m and n each independently represent 0 or 1.

In the general formulae (a1) and (a2), "—*" represents a bond. In the three bonds in the general formula (a1), at least one thereof is bonded to another structural unit, and in the three bonds in the general formula (a2), at least one thereof is bonded to another structural unit. In the bonds in the formulae, the bond that is not bonded to another structural unit is bonded to a hydrogen atom.

However, the benzene ring in the structural unit (a1) and the benzene ring in the structural unit (a2) are bonded to each other via a methylene group, but are not bonded directly. In the case where one molecule has two or more of the structural units (a1), and the structural units (a1) are bonded to each other, the benzene rings of the respective structural units (a1) are bonded to each other via a methylene group, but are not bonded directly. Similarly, in the case where one molecule has two or more of the structural units (a2), and the structural units (a2) are bonded to each other, the benzene rings of the respective structural units (a2) are bonded to each other via a methylene group, but are not bonded directly.

In other words, the bond extending from the benzene ring in the general formula (a1) is bonded to another structural unit or bonded to a hydrogen atom. In the case where the bond is bonded to another structural unit, the bond is bonded to the methylene group of the another structural unit (i.e., another structural unit (a1) or the structural unit (a2), wherein at least one of m and n represents 1).

The bond extending from the methylene group in the general formula (a1) is bonded to the benzene ring of another structural unit (i.e., the structural unit (a2) or another structural unit (a1)).

The bond extending from the benzene ring in the general formula (a2) is bonded to another structural unit or bonded to a hydrogen atom. In the case where the bond is bonded to another structural unit, the bond is bonded to the methylene group of the another structural unit (i.e., the structural unit (a1) or another structural unit (a2), wherein at least one of m and n represents 1).

In the case where m represents 0 (or n represents 0) in the general formula (a2), —$(CH_2)_m$—* (or —$(CH_2)_n$—*) represents a bond (—*) that is same as the bond extending from the benzene ring. Accordingly, the bond is bonded to another structural unit or bonded to a hydrogen atom. In the case where the bond is bonded to another structural unit, the bond is bonded to the methylene group of the another structural unit, as similar to the bond extending from the benzene ring.

In the case where m represents 1 (or n represents 1) in the general formula (a2), —(CH$_2$)$_m$—* (or —(CH$_2$)$_n$—*) represents a methylene group, and the bond thereof is bonded to the benzene ring of another structural unit (i.e., the structural unit (a1) or another structural unit (a2)).

In the general formula (a1), the bonding position of R$^1$ in the benzene ring is preferably the ortho-position (i.e., the 2-position or the 6-position) with respect to the position where the hydroxy group is bonded (i.e., the 1-position) from the standpoint of inexpensiveness and the standpoint of easy liquefaction of the synthesized resin, and in this case, the general formula can be shown by the following general formula (a1-1) or (a1-2).

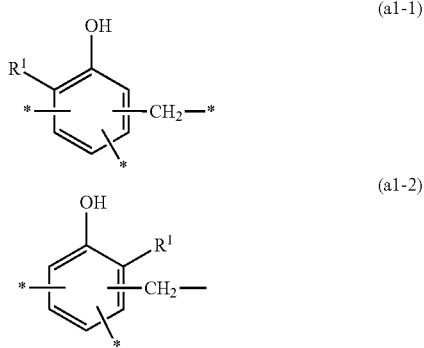

In the general formulae (a1-1) and (a1-2), R$^1$ is the same as R$^1$ in the general formula (a1).

In the general formulae (a1-1) and (a1-2), * can be similarly described as the description for * in the general formula (a1).

In the description herein, the description relating to the structural unit (a1) can be applied to the structural unit (a1-1) and the structural unit (a1-2).

In the general formula (a1), the bonding positions of the single bond and the methylene group in the benzene ring each are not particularly limited. In typical examples, the positions each may be the ortho-position (i.e., the 2-position or the 6-position) and the para-position (i.e., the 4-position) with respect to the position where the hydroxy group is bonded (i.e., the 1-position).

In the formula, the aliphatic hydrocarbon group represented by R$^1$ may be any of chain-like (e.g., linear chain-like and branched chain-like), cyclic, and a combination of chain-like and cyclic, and is preferably chain-like, and more preferably linear chain-like.

The aliphatic hydrocarbon group may be a saturated aliphatic hydrocarbon group having 1 to 9 carbon atoms or an unsaturated aliphatic hydrocarbon group having 2 to 9 carbon atoms. The saturated aliphatic hydrocarbon group having 1 to 9 carbon atoms is preferably a saturated aliphatic hydrocarbon group having 1 to 6 carbon atoms, more preferably a saturated aliphatic hydrocarbon group having 1 to 5 carbon atoms, and further preferably a saturated aliphatic hydrocarbon group having 1 to 3 carbon atoms. The unsaturated aliphatic hydrocarbon group having 2 to 9 carbon atoms is preferably an unsaturated aliphatic hydrocarbon group having 2 to 6 carbon atoms, more preferably an unsaturated aliphatic hydrocarbon group having 2 to 4 carbon atoms, further preferably an unsaturated aliphatic hydrocarbon group having 3 carbon atoms, and particularly preferably an allyl group.

The aliphatic hydrocarbon group represented by R$^1$ optionally have a substituent, and examples of the substituent include a hydroxy group, a halogen atom, an oxygen-containing hydrocarbon group, and a nitrogen-containing cyclic group. Examples of the halogen atom include a fluorine atom, a chlorine atom, a bromine atom, and an iodine atom. Examples of the oxygen-containing hydrocarbon group include an ether bond-containing hydrocarbon group. Examples of the nitrogen-containing cyclic group include a pyridyl group, a pyrimidinyl group, a quinolinyl group, and an imidazolyl group.

The aromatic hydrocarbon group represented by R$^1$ may be any of an aromatic hydrocarbon group having no hetero atom (i.e., an aryl group) or may be a heterocyclic aromatic hydrocarbon group having a hetero atom (i.e., a heteroaryl group), and an aromatic hydrocarbon group having no hetero atom (i.e., an aryl group) is preferred. The aromatic hydrocarbon group has 5 to 15 ring atoms. In the description herein, the number of "ring atoms" means the number of atoms that constitute the aromatic ring (e.g., a carbon atom, a nitrogen atom, and an oxygen atom), and does not include the number of atoms substituted on the aromatic ring (e.g., a hydrogen atom).

The aromatic hydrocarbon group is preferably an aromatic hydrocarbon group having 5 to 12 ring atoms, more preferably an aromatic hydrocarbon group having 6 to 12 ring atoms, and further preferably an aromatic hydrocarbon group having 6 to 10 ring atoms.

The aromatic hydrocarbon group optionally have a substituent, and examples of the substituent include an aliphatic hydrocarbon group having 1 to 5 carbon atoms, a hydroxy group, and a halogen atom. Examples of the halogen atom include a fluorine atom, a chlorine atom, a bromine atom, and an iodine atom.

Examples of the combination of the aliphatic hydrocarbon group and the aromatic hydrocarbon group represented by R$^1$ include -aliphatic hydrocarbon group-aromatic hydrocarbon group-, -aromatic hydrocarbon group-aliphatic hydrocarbon group-, and -aliphatic hydrocarbon group-aromatic hydrocarbon group-aliphatic hydrocarbon group-. Among these, -aliphatic hydrocarbon group-aromatic hydrocarbon group-, which may be referred to as an aralkyl group, is preferred. The aromatic hydrocarbon group and the aliphatic hydrocarbon group can be similarly described as the description for the aromatic hydrocarbon group and the aliphatic hydrocarbon group represented by R$^1$.

X represents a hydrogen atom, a hydroxy group, or a hydroxymethyl group, and preferably a hydrogen atom or a hydroxymethyl group.

The aliphatic hydrocarbon group having 10 to 25 carbon atoms represented by R$^2$ can be similarly described as the description for the aliphatic hydrocarbon group having 10 to 25 carbon atoms contained in the phenol-based resin (A-1). The group represented by R$^2$ is preferably substituted on the meta-position (i.e., the 3-position or the 5-position) with respect to the position where the hydroxy group of the phenol moiety is bonded (i.e., the 1-position), and in this case, the general formula can be shown by the following general formula (a2-1) or (a2-2).

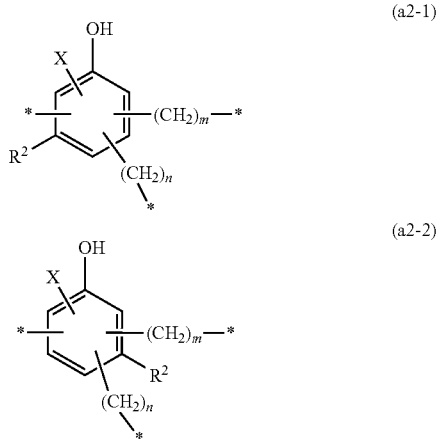

(a2-1)

(a2-2)

In the general formulae (a2-1) and (a2-2), X and $R^2$ are the same as X and $R^2$ in the general formula (a2).

In the general formulae (a2-1) and (a2-2), * can be similarly described as the description for * in the general formula (a2).

In the description herein, the description relating to the structural unit (a2) can be applied to the structural unit (a2-1) and the structural unit (a2-2).

In the case where the phenol-based resin (A-1) has the structural unit (a1), the structural unit (a1) may be constituted by one kind thereof or two or more kinds thereof. In the case where the phenol-based resin (A-1) has the structural unit (a2), the structural unit (a2) may be constituted by one kind thereof or two or more kinds thereof. In other words, the phenol-based resin (A-1) may have plural kinds of $R^1$ and may have plural kinds of $R^2$, but the groups each are preferably constituted by one kind thereof.

In the phenol-based resin (A-1), the molar ratio of the structural unit (a1) with respect to the structural unit (a2) (structural unit (a1)/structural unit (a2) is preferably 0 to 5.0, more preferably 0.25 to 5.0, further preferably 1.0 to 3.0, and particularly preferably 1.0 to 2.0, from the standpoint of the reactivity with (B) a thermosetting resin described later, the low elasticity, and the low hygroscopicity.

(Properties of Phenol-Based Resin (A-1))

The weight average molecular weight (Mw) of the phenol-based resin (A-1) is preferably 4,000 or less, more preferably 1,000 to 3,500, and further preferably 2,000 to 3,000, from the standpoint of the compatibility. With the weight average molecular weight of the phenol-based resin (A-1) of 1,000 or more, there is a tendency that excellent reactivity with (B) a thermosetting resin described later can be obtained, the heat resistance may not be impaired, and the melt viscosity can be retained.

In the description herein, the weight average molecular weight (Mw) is a value that is measured by the gel permeation chromatography (GPC) analysis with tetrahydrofuran (THF) as an eluent, and is a standard polystyrene conversion value. The weight average molecular weight (Mw) may be measured more specifically by the method described in the examples.

The hydroxy group equivalent of the phenol-based resin (A-1) is preferably 90 to 350 g/eq, more preferably 95 to 300 g/eq, further preferably 100 to 250 g/eq, and particularly preferably 100 to 160 g/eq, from the standpoint of the enhancement of the glass transition temperature and the enhancement of the electric insulation reliability. The hydroxy group equivalent may be measured by the method described in the examples.

(Production Method of Phenol-Based Resin (A-1))

The production method of the phenol-based resin (A-1) is not particularly limited, and a known production method of a phenol-based resin may be employed. For example, the production method of a polyhydric hydroxy resin described in JP 2015-89940A may be referred herein and applied thereto.

Examples of an embodiment of the preferred production method include a method, in which a phenol-based compound represented by the following general formula (2) and formaldehyde are reacted in the presence of a basic catalyst, and the resulting product and a phenol-based compound represented by the following general formula (1) are reacted preferably in the presence of an acidic catalyst. The phenol-based compound represented by the following general formula (1) forms the structural unit (a1), and the phenol-based compound represented by the following general formula (2) forms the structural unit (a2).

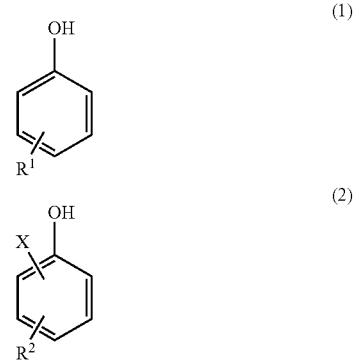

In the general formula (1), $R^1$ is the same as $R^1$ in the general formula (a1), and in the general formula (2), $R^2$ and X are the same as $R^2$ and X in the general formula (a2).

(Content of Phenol-Based Resin (A-1))

The content of the phenol-based resin (A-1) is 0.1 to 40 parts by mass per 100 parts by mass of the total resin content of the thermosetting resin composition of the present invention. With the content of the phenol-based resin (A-1) of 0.1 part by mass or more per 100 parts by mass of the total resin content of the thermosetting resin composition, the low elasticity and the high elongation, which are the characteristics of the phenol-based resin (A-1), can be readily obtained, and with the content thereof of 40 parts by mass or less, there is a tendency of suppressing the decrease of the glass transition temperature (Tg), the decrease of the flame retardancy, and the increase of the tackiness.

From the same standpoint, the content of the phenol-based resin (A-1) is more preferably 5 to 40 parts by mass, further preferably 5 to 25 parts by mass, and particularly preferably 5 to 15 parts by mass, per 100 parts by mass of the total resin content of the thermosetting resin composition.

In the description herein, the "total resin content" means the total amount of the components except for (D) a filler and an organic solvent described later, which may be contained depending on necessity.

((A-2): Phenol-Based Resin that does not have Aliphatic Hydrocarbon Group Having 10 to 25 Carbon Atoms)

The phenol-based resin (A) may further contain (A-2) a phenol-based resin that does not have an aliphatic hydrocarbon group having 10 to 25 carbon atoms (which may be hereinafter referred to as a phenol-based resin (A-2)), and preferably contains the phenol-based resin (A-2) from the standpoint of the securement of the adhesion strength to a metal foil. The aliphatic hydrocarbon group having 10 to 25 carbon atoms herein can be similarly described as the description in the phenol-based resin (A-1).

The phenol-based resin (A-2) used may be a known phenol-based resin that does not have an aliphatic hydrocarbon group having 10 to 25 carbon atoms. In particular, from the standpoint of the low hygroscopicity, a phenol novolac resin, a cresol novolac type phenol resin, and a biphenyl novolac type phenol resin are preferred, and a cresol novolac type phenol resin is more preferred.

(Properties of Phenol-Based Resin (A-2))

The hydroxy group equivalent of the phenol-based resin (A-2) is preferably 80 to 300 g/eq, more preferably 80 to 200 g/eq, and further preferably 80 to 150 g/eq, from the standpoint of the enhancement of the glass transition temperature and the enhancement of the electric insulation reliability.

The phenol-based resin (A-2) used may be a commercially available product, and examples thereof include "KA-1165" (a trade name, produced by DIC Corporation), which is a cresol novolac type phenol-based resin, and "MEH-7851" (a trade name, produced by Meiwa Plastic Industries, Ltd.), which is a biphenyl novolac type phenol-based resin.

The content ratio of the phenol-based resin (A-1) with respect to the total amount of the phenol-based resin (A-1) and the phenol-based resin (A-2) is preferably 30 to 95% by mass. With the content ratio within the range, there is a tendency that the high adhesion strength to a metal foil can be obtained while achieving the low elasticity, the high heat resistance, and the high elongation. From the same standpoint, the content ratio thereof is more preferably 50 to 95% by mass, further preferably 60 to 95% by mass, and particularly preferably 70 to 90% by mass.

[(B): Thermosetting Resin]

The thermosetting resin composition of the present invention may further contain a thermosetting resin as a component (B) (which may be referred to as a thermosetting resin (B)), and preferably contains the thermosetting resin (B) from the standpoint of the heat resistance, the electric insulation reliability, and the high glass transition temperature. The component (B) does not include the component (A).

The thermosetting resin (B) used may be a known thermosetting resin without particular limitation, and for example, is preferably at least one kind selected from the group consisting of an epoxy resin, a cyanate resin, a bismaleimide-based compound, an addition polymer of a bismaleimide-based compound and a diamine, an isocyanate resin, a triallyl isocyanurate resin, a triallyl cyanurate resin, and a vinyl group-containing polyolefin. Among these, an epoxy resin and a cyanate resin are preferred, and an epoxy resin is more preferred, from the standpoint of the balance among the capabilities, such as the heat resistance and the electric insulation reliability.

The epoxy resin used is preferably an epoxy resin having two or more epoxy groups in one molecule from the standpoint of the enhancement of the heat resistance and the glass transition temperature. The epoxy resin herein can be classified into a glycidyl ether type epoxy resin, a glycidyl amine type epoxy resin, a glycidyl ester type epoxy resin, and the like. Among these, a glycidyl ether type epoxy resin is preferred.

The epoxy resin used may be a known product. In particular, at least one kind selected from the group consisting of a bisphenol A type epoxy resin, a bisphenol F type epoxy resin, a bisphenol S type epoxy resin, a biphenyl type epoxy resin, a phenol novolac type epoxy resin, a cresol novolac type epoxy resin, a bisphenol A novolac type epoxy resin, a phosphorus-containing epoxy resin, a napthalene skeleton-containing epoxy resin, an aralkylene skeleton-containing epoxy resin, a phenol biphenyl aralkyl type epoxy resin, a phenol salicylaldehyde novolac type epoxy resin, a lower alkyl group-substituted phenol salicylaldehyde novolac type epoxy resin, a dicyclopentadiene skeleton-containing epoxy resin, a polyfunctional glycidyl amine type epoxy resin, a polyfunctional alicyclic epoxy resin, and a tetrabromobisphenol A type epoxy resin is preferably used.

The weight average molecular weight (Mw) of the epoxy resin is preferably 200 to 1,000, and more preferably 300 to 900. With the weight average molecular weight of 200 or more, there is a tendency that the heat resistance is enhanced, and with the weight average molecular weight of 1,000 or less, there is a tendency that the compatibility with the component (A) is improved.

The epoxy equivalent of the epoxy resin is preferably 150 to 500 g/eq, more preferably 150 to 450 g/eq, and further preferably 150 to 300 g/eq, from the standpoint of the compatibility.

The epoxy resin used may be a commercially available product, and examples of the commercially available product include "jER1001" (a trade name, produced by Mitsubishi Chemical Corporation), which is a bisphenol A type epoxy resin, "N770" (a trade name, produced by DIC Corporation), which is a phenol novolac type epoxy resin, "NC-3000H" (a trade name, produced by Nippon Kayaku Co., Ltd.), which is a phenol biphenyl aralkyl type epoxy resin, "EPICLON N-660" (a trade name, produced by DIC Corporation), which is a cresol novolac type epoxy resin, "ZX-1548" (a trade name, produced by Tohto Kasei Co., Ltd.), which is a phosphorus-containing epoxy resin, "HP-9900" (a trade name, produced by DIC Corporation), which is a naphthalene skeleton-containing epoxy resin, and "EPICLON 153" (a trade name, produced by DIC Corporation), which is a tetrabromobisphenol A type epoxy resin.

The cyanate resin used may be a known product. Examples of the cyanate resin include a novolac type cyanate resin, a bisphenol A type cyanate resin, a bisphenol E type cyanate resin, a bisphenol F type cyanate resin, a tetramethylbisphenol F type cyanate resin, and a dicyclopentadiene type cyanate resin. The cyanate resin may be used alone or as a combination of two or more kinds thereof.

As for the other thermosetting resins exemplified as the thermosetting resin (B), known products may be used.

(Content of Component (B))

In the case where the thermosetting resin composition of the present invention contains the component (B), the content of the component (B) is preferably 40 to 90 parts by mass, more preferably 50 to 90 parts by mass, and further preferably 60 to 80 parts by mass, per 100 parts by mass of the total resin content of the thermosetting resin composition.

While not particularly limiting, the number of the phenolic hydroxy group of the component (A) is preferably controlled to 0.5 to 1.5 equivalents with respect to the functional group (such as an epoxy group) of the component (B).

With the content of the component (B) within the range, there is a tendency that the adhesion strength to a metal foil is retained, and the decrease of the glass transition temperature and the electric insulation reliability is suppressed.

[(C): Curing Accelerator]

The thermosetting resin composition of the present invention may contain a curing accelerator as a component (C) (which may be referred to as a curing accelerator (C)), and preferably contains the same. The curing accelerator (C) may be appropriately selected depending on the kind of the thermosetting resin (B), and may be used alone or as a combination of two or more kinds thereof.

For example, in the case where an epoxy resin is used as the thermosetting resin (B), while not particularly limiting, at least one kind selected from the group consisting of an amine compound and an imidazole compound is preferably contained, and an imidazole compound is more preferably contained.

Examples of the amine compound include dicyandiamide, diaminodiphenylethane, and guanylurea.

Examples of the imidazole compound include 2-phenylimidazole, 1-cyanoethyl-2-methylimidazole, 1-cyanoethyl-2-undecylimidazole, 1-cyanoethyl-2-phenylimidazole, 1-cyanoethyl-2-phenylimidazolium trimellitate, and benzimidazole.

In the case where the thermosetting resin composition of the present invention contains the curing accelerator (C), the content of the curing accelerator (C) is preferably 0.01 to 10 parts by mass, more preferably 0.01 to 5 parts by mass, further preferably 0.01 to 3 parts by mass, and particularly preferably 0.05 to 3 parts by mass, per 100 parts by mass of the total resin content of the thermosetting resin composition. In the case where an epoxy resin is contained as the thermosetting resin (B), the content of the curing accelerator (D) may also be determined depending on the total amount of oxirane rings in the thermosetting resin composition.

[(D): Filler]

The thermosetting resin composition of the present invention may contain a filler as a component (D) (which may be referred to as a filler (D)), and preferably contains the same. The filler may be used alone or as a combination of two or more kinds thereof.

The filler (D) is not particularly limited, and a known product may be used. The filler (D) may be any of an organic filler and an inorganic filler. The filler (D) preferably contains an inorganic filler from the standpoint of the low thermal expansion rate and the flame retardancy. The inorganic filler may be used alone or as a combination of two or more kinds thereof.

Examples of the inorganic filler include silica, alumina, titanium oxide, mica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clay (such as calcined clay), talc, aluminum borate, and silicon carbide. Among these, silica is preferred from the standpoint of the low dielectric constant, the low linear thermal expansion rate, and the like. Examples of the silica include precipitated silica having a high water content produced by a wet method and dry method silica having substantially no combined water or the like produced by a dry method, and examples of the dry method silica include pulverized silica, fumed silica, and molten silica (molten spherical silica), depending on difference in production method. Among these, the silica is more preferably molten silica (molten spherical silica) or pulverized silica.

The shape and particle diameter of the filler (D) are not particularly limited, and for example, the average particle diameter is preferably 0.1 to 10 µm, and more preferably 0.1 to 4.0 µm. With the average particle diameter of 0.1 µm or more, there is a tendency that the dispersibility of the filler is improved, and the viscosity of the varnish is decreased, resulting in improved handleability. With the average particle diameter of 10 µm or less, there is a tendency that the sedimentation of the filler (D) in the varnish formation is difficult to occur. The average particle diameter herein means the particle diameter at the point corresponding to 50% volume in the cumulative frequency curve of the particle diameter obtained by assuming the total volume of the particles as 100%, and may be measured by a particle size distribution measuring device using the laser diffraction scattering method or the like.

In the case where the thermosetting resin composition of the present invention contains the filler (D), the content of the filler (D) is preferably 5 to 40 parts by mass, more preferably 10 to 40 parts by mass, and further preferably 15 to 35 parts by mass, per 100 parts by mass of the total resin content of the thermosetting resin composition. With the content of the filler (D) of 5 parts by mass or more, there is a tendency that the linear thermal expansion rate is decreased, the sufficient heat resistance is obtained, and the low tackiness is obtained. With the content of the filler (D) of 40 parts by mass or less, there is a tendency that the cured product of the resin composition is prevented from becoming brittle, and the effect of low elasticity derived from the phenol-based resin (A-1) can be sufficiently obtained.

[Other Components]

The thermosetting resin composition of the present invention may further contain a curing agent (except for the component (A)); a crosslinking agent, such as isocyanate and melamine; a rubber-based elastomer; a flame retardant, such as a phosphorus-based compound; conductive particles; a coupling agent; a flow modifier; an antioxidant; a pigment; a leveling agent; a defoaming agent; and an ion trapping agent. These materials used may be known products.

The coupling agent is preferably contained since the coupling agent exerts the effect of the enhancement of the dispersibility of the filler (D) and the enhancement of the adhesiveness to a base material of a prepreg and the adhesiveness to a metal foil. The coupling agent is preferably a silane coupling agent, and examples of the silane coupling agent include an epoxy silane-based coupling agent, an amino silane-based coupling agent, a vinyl silane-based coupling agent, a phenyl silane-based coupling agent, an alkyl silane-based coupling agent, an alkenyl silane-based coupling agent, an alkynyl silane-based coupling agent, a haloalkyl silane-based coupling agent, a siloxane-based coupling agent, a hydrosilane-based coupling agent, a silazane-based coupling agent, an alkoxy silane-based coupling agent, a chlorosilane-based coupling agent, a (meth)acryl-silane-based coupling agent, an isocyanurate silane-based coupling agent, an ureido silane-based coupling agent, a mercapto silane-based coupling agent, a sulfide silane-based coupling agent, and an isocyanate silane-based coupling agent. Among these, an epoxy silane-based coupling agent is preferred. The coupling agent may be used alone or as a combination of two or more kinds thereof.

In the case where the thermosetting resin composition of the present invention contains a coupling agent, the content thereof is preferably 0.01 to 20 parts by mass, more preferably 0.01 to 5 parts by mass, and further preferably 0.05 to 2 parts by mass, per 100 parts by mass of the total resin content of the thermosetting resin composition.

In the case where the thermosetting resin composition of the present invention contains components other than the coupling agent, the contents thereof may be appropriately controlled depending on the purposes thereof.

[Organic Solvent]

The thermosetting resin composition of the present invention may contain an organic solvent from the standpoint of the enhancement of the handleability thereof through dilution and the standpoint of the enhancement of the productivity of a prepreg described later. The thermosetting resin composition that contains an organic solvent may be referred to as a varnish. The organic solvent may be the organic solvent that is used in the production of the component (A) or the component (B) and is contained directly in the thermosetting resin composition of the present invention, or may be a solvent that is newly mixed therein, without particular limitation.

The organic solvent is not particularly limited, and examples thereof used include a ketone-based solvent, an aromatic hydrocarbon-based solvent, an ester-based solvent, an amide-based solvent, and an alcohol-based solvent. Specifically, examples of the ketone-based solvent include acetone, methyl ethyl ketone, methyl isobutyl ketone, and cyclohexanone. Examples of the aromatic hydrocarbon-based solvent include toluene and xylene. Examples of the ester-based solvent include methoxyethyl acetate, ethoxyethyl acetate, butoxyethyl acetate, and ethyl acetate. Examples of the amide-based solvent include N-methylpyrrolidone, formamide, N-methylformamide, and N,N-dimethylacetamide. Examples of the alcohol-based solvent include methanol, ethanol, ethylene glycol, ethylene glycol monomethyl ether, ethylene glycol monoethyl ether, diethylene glycol, triethylene glycol monomethyl ether, triethylene glycol monoethyl ether, triethylene glycol, propylene glycol monomethyl ether, dipropylene glycol monomethyl ether, propylene glycol monopropyl ether, and dipropylene glycol monopropyl ether. The organic solvent may be used alone or as a combination of two or more kinds thereof.

Among these, a ketone-based solvent is preferred from the standpoint of the solubility.

The varnish preferably has a concentration of non-volatile content of 25 to 65% by mass from the standpoint of the handleability, the impregnation capability to a base material of a prepreg, and the appearance of a prepreg. In the description herein, the "non-volatile content" means the component that remains after removing the organic solvent contained in the thermosetting resin composition, and includes the filler (D).

[Prepreg]

The present invention also provides a prepreg that includes the thermosetting resin composition of the present invention. The prepreg of the present invention may be obtained by impregnating a base material with the thermosetting resin composition of the present invention, followed by drying. The base material is not particularly limited, as far as it is a base material that is used in the production of a metal-clad laminate or a printed wiring board, and in general, a fiber base material, such as a woven fabric or a nonwoven fabric, is used. Examples of the material of the fiber base material include inorganic fibers, such as glass, alumina, asbestos, boron, silica-alumina glass, silica glass, tyranno, silicon carbide, silicon nitride, and zirconia, organic filers, such as aramid, polyether ether ketone, polyether imide, polyether sulfone, carbon, and cellulose, and fibers obtained by mixing these fibers. The fiber base material used is preferably a glass cloth having a thickness of 160 µm or less (preferably 10 to 160 µm, more preferably 10 to 100 µm, and further preferably 20 to 50 µm). A glass cloth having a thickness of 50 µm or less is more preferably used since a printed wiring board that can be arbitrarily folded can be obtained, and the dimensional change due to the temperature, moisture absorption, and the like in the production process can be suppressed.

The production condition of the prepreg is not particularly limited, and the prepreg is preferably obtained by vaporizing 80% by mass or more of the organic solvent contained in the varnish. The drying temperature is preferably 80 to 180° C., and more preferably 110 to 160° C., and the drying time may be appropriately determined in consideration of the relationship to the gelation time of the varnish. The prepreg obtained in this manner preferably has a non-volatile content of the varnish of 30 to 80% by mass based on the total amount of the non-volatile content of the varnish and the base material.

[Metal Foil with Resin]

The present invention also provides a metal foil with a resin including the thermosetting resin composition of the present invention and a metal foil laminated on each other. The metal foil with a resin may be produced, for example, by coating the thermosetting resin composition (varnish) of the present invention on a metal foil, followed by drying. The drying condition is not particularly limited, and the thermosetting resin composition may be dried at 80 to 180° C., and more preferably 110 to 160° C.

The coating method is not particularly limited, and a known coating device, such as a die coater, a comma coater, a bar coater, a kiss coater, and a roll coater, may be used.

[Laminate]

The present invention also provides a laminate including the prepreg of the present invention or the metal foil with a resin of the present invention. The laminate of the present invention may include plural plies of the prepregs of the present invention that are laminated on each other and pressed under heating.

The laminate of the present invention may be a laminated article including a laminate of plural plies of prepregs that are different from the present invention and a laminate of plural plies of the prepregs of the present invention. Examples of the laminate of plural plies of prepregs that are different from the present invention include a laminate having a storage elastic modulus that is higher than that of the laminate of plural plies of the prepregs of the present invention. In this embodiment, the occurrence of cracks in a printed wiring board in the case where only the laminate of plural plies of prepregs that are different from the present invention is used can be suppressed since the stress relaxation effect can be obtained by the laminate of plural plies of the prepregs of the present invention.

In particular, a metal-clad laminate can be produced, for example, in such a manner that metal foils are laminated on the adhesive surfaces on both sides of the laminate, which are molded with heat and pressure under a vacuum press condition of preferably 130 to 250° C., and more preferably 150 to 230° C., and preferably 0.5 to 10 MPa, and more preferably 1 to 5 MPa.

A metal-clad laminate can also be produced in such a manner that the metal foils with a resin of the present invention are laminated to make the resin surfaces thereof face each other, and pressed under the vacuum press condition. The heating and pressing method is not particularly limited, and for example, a multiplaten press, a multiplaten vacuum press, a continuous molding machine, an autoclave molding machine, or the like may be used.

The metal foil used in the metal foil with a resin and the metal-clad laminate of the present invention is not particularly limited, and for example, a copper foil and an aluminum foil are generally used. The thickness of the metal foil is not particularly limited, and may be generally selected from 1 to 200 μm, which is the thickness of the metal foil used in the laminate, and is preferably 10 to 100 μm, and more preferably 10 to 50 μm.

In addition, for example, the metal foil used may be a composite foil having a three-layer structure including an intermediate layer of nickel, a nickel-phosphorus alloy, a nickel-tin alloy, a nickel-iron alloy, lead, a lead-tin alloy, or the like, having a copper layer of 0.5 to 15 μm and a copper layer of 10 to 300 μm provided on both surfaces of the intermediate layer, and may be a composite foil having two-layer structure including aluminum and a copper foil.

(Storage Elastic Modulus)

The storage elastic modulus of the cured product (laminate) obtained from the resin composition of the present invention is preferably $4.0 \times 10^9$ Pa or less, more preferably $2.0 \times 10^9$ Pa or less, further preferably $1.9 \times 10^9$ Pa or less, and particularly preferably $1.8 \times 10^9$ Pa or less, from the standpoint of the achievement of the stress relaxation effect. The lower limit of the storage elastic modulus is not particularly limited, and may be $1.0 \times 10^9$ Pa, may be $1.1 \times 10^9$ Pa, and may be $1.2 \times 10^9$ Pa.

(Tensile Elongation Rate)

The tensile elongation rate of the cured product (laminate) obtained from the resin composition of the present invention under an ordinary temperature environment (at 25° C. herein) is preferably 3.0% or more, more preferably 3.2% or more, and further preferably 3.5% or more, from the standpoint of the achievement of the stress relaxation effect. The upper limit thereof is not particularly limited, and is generally 6.0% or less, and may be 5.0% or less.

The tensile elongation rate thereof under a high temperature environment (at 125° C. herein) is preferably 5.0% or more, more preferably 5.4% or more, further preferably 5.7% or more, particularly preferably 6.0% or more, and most preferably 6.5% or more, from the standpoint of the achievement of the stress relaxation effect under a high temperature environment and the restoration capability against thermal expansion caused by temperature change between an ordinary temperature environment and a high temperature environment. The upper limit thereof is not particularly limited, and is generally 12.0% or less, and may be 11.0% or less.

The storage elastic modulus and the tensile elongation rate may be measured by the methods described in the examples.

(Adhesiveness to Metal Foil)

In the cured product (metal-clad laminate) obtained from the resin composition of the present invention, the adhesiveness to the metal foil at 25° C. that is measured according to the method described in the examples is preferably 0.80 kN/m or more, more preferably 1.0 kN/m or more, further preferably 1.20 kN/m or more, and particularly preferably 1.30 kN/m or more. The upper limit thereof is not particularly limited, and is generally 2.0 kN/m or less, and may be 1.80 kN/m or less.

The adhesiveness to the metal foil at 125° C. is preferably 0.40 kN/m or more, more preferably 0.50 kN/m or more, further preferably 0.60 kN/m or more, and particularly preferably 0.70 kN/m or more. The upper limit thereof is not particularly limited, and is generally 1.50 kN/m or less, and may be 1.30 kN/m or less, and may be 1.0 kN/m or less.

[Printed Wiring Board]

The present invention also provides a printed wiring board including the laminate of the present invention. The printed wiring board of the present invention may be obtained by forming a circuit in the laminate of the present invention. The production method of the printed wiring board of the present invention is not particularly limited, and the printed wiring board may be produced, for example, by forming a circuit (wiring) in the metal foil of the laminate (metal-clad laminate) of the present invention having the metal foil provided on one surface or both surfaces thereof.

The printed wiring board of the present invention may be a flexible printed wiring board.

[Semiconductor Package]

The semiconductor package of the present invention includes the printed wiring board of the present invention, and more specifically includes the printed wiring board of the present invention having a semiconductor mounted thereon. The semiconductor package of the present invention may be produced by mounting a semiconductor chip, a memory, and the like on the prescribed positions of the printed wiring board of the present invention.

EXAMPLES

The present invention will be described specifically with reference to examples and comparative examples shown below, but the present invention is not limited thereto.

Synthesis Example 1

Production of Phenol-Based Resin (A-1)
(Synthesis of Phenol-Based Resin (A-1-a))

In a glass flask having a capacity of 2 L equipped with a thermometer, a stirrer, and a condenser tube, 300 g (1.0 mol) of cardanol, 150 g of methanol, and 120 g (2.0 mol) of a 50% formaldehyde aqueous solution were charged, and a 30% sodium hydroxide aqueous solution was added dropwise to the mixed solution over 2 hours. Thereafter, the solution was heated to 45° C. and reacted for 6 hours. Subsequently, after adding 35% hydrochloric acid to the resulting reaction solution for neutralizing sodium hydroxide, 1,342 g (10 mol) of o-allylphenol was added, 1.34 g of oxalic acid (0.1% by mass based on o-allylphenol) was added to make the system acidic, and after heating to 100° C., the reaction was performed for 5 hours. Thereafter, the reaction solution was rinsed with water, and then excessive o-allylphenol was distilled off to provide a phenol-based resin (A-1-a).

The resulting phenol-based resin (A-1-a) had a weight average molecular weight (Mw) of 1,412 and a hydroxy group equivalent of 214 g/eq.

The weight average molecular weight herein was obtained by the gel permeation chromatography (GPC) method through conversion with the calibration curve using the standard polystyrene. The calibration curve was approximated by the cubic equation using the standard polystyrene, TSK standard POLYSTYRENE (Type; A-2500, A-5000, F-1, F-2, F-4, F-10, F-20, F-40) (a trade name, produced by Tosoh Corporation). The measurement condition of GPC was as follows.

Equipment:
  Pump: Model L-6200 (produced by Hitachi High-Technologies Corporation)
  Detector: Model L-3300 RI (produced by Hitachi High-Technologies Corporation)

Column oven: L-655A-52 (produced by Hitachi High-Technologies Corporation)
Column: guard column: TSK Guardcolumn HHR-L+ columns: TSKgel G4000 HHR+TSKgel G2000 HHR (all trade names, produced by Tosho Corporation)
Column size: 6.0 mm×40 mm (guard column), 7.8 mm×300 mm (columns)
Eluent: tetrahydrofuran
Specimen concentration: 30 mg/5 mL
Injection amount: 20 μL
Flow rate: 1.00 mL/min
Measurement temperature: 40° C.

The hydroxy group equivalent (g/eq) of the phenol-based resin was measured by titration of the acetylation method with acetic anhydride using an automatic titrator "COM-1700S" (produced by Hiranuma, Inc.)

Synthesis Example 2

Production of Phenol-Based Resin (A-1)
(Synthesis of Phenol-Based Resin (A-1-b))

In a glass flask having a capacity of 2 L equipped with a thermometer, a stirrer, and a condenser tube, 248 g (1.0 mol) of p-(4-pentylcyclohexyl)phenol, 150 g of methanol, and 120 g (2.0 mol) of a 50% formaldehyde aqueous solution were charged, and a 30% sodium hydroxide aqueous solution was added dropwise to the mixed solution over 2 hours. Thereafter, the solution was heated to 45° C. and reacted for 6 hours. Subsequently, after adding 35% hydrochloric acid to the resulting reaction solution for neutralizing sodium hydroxide, 1,342 g (10 mol) of o-allylphenol was added, 1.34 g of oxalic acid (0.1% by mass based on o-allylphenol) was added to make the system acidic, and after heating to 100° C., the reaction was performed for 5 hours. Thereafter, the reaction solution was rinsed with water, and then excessive o-allylphenol was distilled off to provide a phenol-based resin (A-1-b).

The resulting phenol-based resin (A-1-b) had a weight average molecular weight (Mw) of 1,738 and a hydroxy group equivalent of 238 g/eq. The measurement methods of the weight average molecular weight (Mw) and the hydroxy group equivalent were as shown in Synthesis Example 1.

Example 1

The phenol-based resin (A-1-a) obtained in Synthesis Example 1 as the component (A-1), a cresol novolac type phenol resin (produced by DIC Corporation, hydroxy group equivalent: 119 g/eq) as the component (A-2), a dicyclopentadiene type epoxy resin (produced by DIC Corporation, epoxy equivalent: 254 g/eq) as the thermosetting resin (B), pulverized silica (produced by Fukushima Yogyo Ltd.) as the filler (D), and "A-187" (a trade name, produced by Momentive Performance Materials Inc.) as a coupling agent were mixed in the mixing amounts shown in Table 1, and dissolved in methyl isobutyl ketone, and then 2-methylimidazole as the curing accelerator (C) was mixed according to Table 1, so as to provide a varnish having a non-volatile content of 40% by mass.

Example 2

The same operation as in Example 1 was performed except that the amounts of the component (A-1) and the component (A-2) mixed were changed as shown in Table 1, so as to provide a varnish having a non-volatile content of 40% by mass.

Example 3

The same operation as in Example 1 was performed except that a tetrabromobisphenol A type epoxy resin (produced by DIC Corporation, epoxy equivalent: 400 g/eq) was used as the thermosetting resin (B) instead of the dicyclopentadiene type epoxy resin, so as to provide a varnish having a non-volatile content of 40% by mass.

Example 4

The same operation as in Example 3 was performed except that the amounts of the component (A-1) and the component (A-2) mixed were changed as shown in Table 1, so as to provide a varnish having a non-volatile content of 40% by mass.

Example 5

The same operation as in Example 1 was performed except that a naphthalene skeleton-containing novolac type epoxy resin (produced by DIC Corporation) was used as the thermosetting resin (B) instead of the dicyclopentadiene type epoxy resin, so as to provide a varnish having a non-volatile content of 40% by mass.

Example 6

The same operation as in Example 5 was performed except that the amounts of the component (A-1) and the component (A-2) mixed were changed as shown in Table 1, so as to provide a varnish having a non-volatile content of 40% by mass.

Example 7

The same operation as in Example 1 was performed except that a phenol novolac type epoxy resin (produced by DIC Corporation) was used as the thermosetting resin (B) instead of the dicyclopentadiene type epoxy resin, so as to provide a varnish having a non-volatile content of 40% by mass.

Example 8

The same operation as in Example 7 was performed except that the amounts of the component (A-1) and the component (A-2) mixed were changed as shown in Table 1, so as to provide a varnish having a non-volatile content of 40% by mass.

Example 9

The same operation as in Example 1 was performed except that a phenol biphenyl aralkyl type epoxy resin (produced by Nippon Kayaku Co., Ltd.) was used as the thermosetting resin (B) instead of the dicyclopentadiene type epoxy resin, so as to provide a varnish having a non-volatile content of 40% by mass.

Example 10

The same operation as in Example 9 was performed except that the amounts of the component (A-1) and the component (A-2) mixed were changed as shown in Table 1, so as to provide a varnish having a non-volatile content of 40% by mass.

Example 11

The same operation as in Example 2 was performed except that the "phenol-based resin (A-1-b) obtained in Synthesis Example 2" was used as the component (A-1) instead of the "phenol-based resin (A-1-a) obtained in Synthesis Example 1", so as to provide a varnish having a non-volatile content of 40% by mass.

Example 12

The same operation as in Example 4 was performed except that the "phenol-based resin (A-1-b) obtained in Synthesis Example 2" was used as the component (A-1) instead of the "phenol-based resin (A-1-a) obtained in Synthesis Example 1", so as to provide a varnish having a non-volatile content of 40% by mass.

Example 13

The same operation as in Example 6 was performed except that the "phenol-based resin (A-1-b) obtained in Synthesis Example 2" was used as the component (A-1) instead of the "phenol-based resin (A-1-a) obtained in Synthesis Example 1", so as to provide a varnish having a non-volatile content of 40% by mass.

Example 14

The same operation as in Example 8 was performed except that the "phenol-based resin (A-1-b) obtained in Synthesis Example 2" was used as the component (A-1) instead of the "phenol-based resin (A-1-a) obtained in Synthesis Example 1", so as to provide a varnish having a non-volatile content of 40% by mass.

Example 15

The same operation as in Example 10 was performed except that the "phenol-based resin (A-1-b) obtained in Synthesis Example 2" was used as the component (A-1) instead of the "phenol-based resin (A-1-a) obtained in Synthesis Example 1", so as to provide a varnish having a non-volatile content of 40% by mass.

Example 16

The same operation as in Example 15 was performed except that the amounts of the component (A-1) and the component (A-2) mixed were changed as shown in Table 2, so as to provide a varnish having a non-volatile content of 40% by mass.

Examples 17 and 18

The same operation as in Example 3 was performed except that the amounts of the component (A-1), the component (A-2), and the component (B) mixed were changed as shown in Table 2, so as to provide a varnish having a non-volatile content of 40% by mass.

[Comparative Example 1] (No Component (A-1))

A cresol novolac type phenol resin (produced by DIC Corporation, hydroxy group equivalent: 119 g/eq) as the component (A-2), a dicyclopentadiene type epoxy resin (produced by DIC Corporation, epoxy equivalent: 254 g/eq) as the thermosetting resin (B), pulverized silica (produced by Fukushima Yogyo Ltd.) as the filler (D), and "A-187" (a trade name, produced by Momentive Performance Materials Inc.) as a coupling agent were mixed in the mixing amounts shown in Table 2, and dissolved in methyl isobutyl ketone, and then 2-methylimidazole as the curing accelerator (C) was mixed according to Table 2, so as to provide a varnish having a non-volatile content of 40% by mass.

[Comparative Example 2] (No Component (A-1))

The same operation as in Comparative Example 1 was performed except that a naphthalene skeleton-containing novolac type epoxy resin (produced by DIC Corporation) was used as the component (B) instead of the dicyclopentadiene type epoxy resin, so as to provide a varnish having a non-volatile content of 40% by mass.

[Comparative Example 3] (No Component (A-1))

The same operation as in Comparative Example 1 was performed except that a phenol biphenyl aralkyl type epoxy resin (produced by Nippon Kayaku Co., Ltd.) was used as the component (B) instead of the dicyclopentadiene type epoxy resin, so as to provide a varnish having a non-volatile content of 40% by mass.

A prepreg, a copper foil with a resin, and a copper-clad laminate were produced in the following manner by using each of the varnishes produced in the examples, and were evaluated by the methods described later.

[Production of Prepreg]

A glass cloth 1037 (a trade name, produced by Asahi-Schwebel Co., Ltd.) having a thickness of 0.028 mm was impregnated with each of the varnishes produced in the examples, followed by drying under heating to 140° C. for 10 minutes, so as to provide a prepreg.

[Production of Copper Foil with Resin]

The varnishes produced in the examples each were coated and molded on an electrolytic copper foil "YGP-35" (a trade name, produced by Nippon Denkai, Ltd.) having a thickness of 35 μm with a coating machine, and dried with hot air at 140° C. for approximately 6 minutes, so as to produce a copper foil with a resin having a coating thickness of 50 μm.

[Production of Copper-Clad Laminate]

On both sides of 4 plies of the prepregs, electrolytic copper foils "YGP-35" (a trade name, produced by Nippon Denkai, Ltd.) having a thickness of 35 μm were laminated in such a manner that the adhesive surfaces thereof were brought into contact with the prepreg, which were molded under a vacuum press condition of 200° C. and 4 MPa for 60 minutes, so as to produce a double-sided copper-clad laminate.

The copper foils with a resin were laminated with the resin surfaces thereof facing each other, and were molded under a vacuum press condition of 200° C. and 4 MPa for 60 minutes, so as to produce a double-sided copper-clad laminate.

[Production of Multilayer Board Having Core Base Material]

The copper foil of a glass-epoxy copper-clad laminate "MCL-E-75G" (a trade name, produced by Hitachi Chemical Co., Ltd.) having a thickness of 1.0 mm was etched to form a circuit, and 2 plies of the prepregs were provided to intervene between the core substrate thus obtained and an electrolytic copper foil "YGP-18" (a trade name, produced by Nippon Denkai, Ltd.) having a thickness of 18 μm, which were molded under a vacuum press condition of 200° C. and 4 MPa for 60 minutes, so as to produce a multilayer board, which was designated as a multilayer board for evaluation.

[Evaluation Methods for Varnish, Prepreg, and Copper-Clad Laminate]

(1) Varnish Property (Compatibility of Components)

The varnish thus produced was placed in a transparent vessel, and the appearance thereof after 24 hours was visually observed for the separation of the varnish and the presence of precipitate, which were evaluated by the following evaluation standard. The grade A means excellent varnish property. The results are shown in Tables 1 and 2.

A: The varnish was uniform in color, which was judged as non-separation, and accumulation of precipitate was not visually confirmed.

B: The varnish was not uniform in color, which was judged as separation, or accumulation of precipitate was visually confirmed.

(2) Varnish Property (Viscosity)

The varnish thus produced was placed in a cup, the temperature of the varnish was controlled to 30° C. with a water bath, and then the viscosity of the varnish was calculated with a BL-type viscometer (produced by Toki Sangyo Co., Ltd.). A viscosity at 30° C. of 800 mPa·s or less was judged as no problem in the production of the prepreg. The results are shown in Tables 1 and 2.

(3) Appearance of Prepreg (Presence of Aggregate)

The appearance of the prepreg was observed with a magnifying glass with a magnification of 20 for the occurrence of aggregate, and evaluated by the following evaluation standard. The results are shown in Tables 1 and 2.

A: No aggregate confirmed

B: Aggregate confirmed (4) Storage Elastic Modulus

The storage elastic modulus was evaluated in such a manner that the double-sided copper-clad laminate produced by laminating the copper foils with a resin with the resin surfaces thereof facing each other was etched on the entire surface thereof to provide a laminate, which was cut into 5 mm in width and 30 mm in length and measured for the storage elastic modulus with a dynamic viscoelasticity measuring device (produced by UBM Co., Ltd.). A specimen having a storage elastic modulus at 25° C. of $4.0 \times 10^9$ Pa or less was judged to have sufficiently low elasticity capable of exhibiting the stress relaxation effect and suppressing the occurrence of cracks in the printed wiring board. A specimen having a storage elastic modulus of $2.0 \times 10^9$ Pa or less was more preferred from the same standpoint. The results are shown in Tables 1 and 2.

(5) Tensile Elongation Rate (at 25° C. and 125° C.)

The double-sided copper-clad laminate produced by laminating the copper foils with a resin with the resin surfaces thereof facing each other was etched on the entire surface thereof to provide a laminate, which was cut into 10 mm in width and 100 mm in length and measured for the tensile elongation rate at 25° C. and 125° C. with Autograph for isothermal analysis (produced by Shimadzu Corporation). A specimen having a tensile elongation rate at 25° C. of 3.0% or more and a tensile elongation rate at 125° C. of 5.0% or more was judged to be capable of exhibiting the stress relaxation effect and suppressing the occurrence of cracks in the printed wiring board. The results are shown in Tables 1 and 2.

(6) Heat Resistance

The double-sided copper-clad laminate produced from 4 plies of the prepregs was cut into a 50 mm square shape to provide a test piece. The test piece was floated on a solder bath at 260° C., and the elapsed time from the floating until blister was visually found on the test piece was measured and designated as an index of the heat resistance. The elapsed time was measured by 300 seconds, and an elapsed time of 300 seconds or more was judged to be sufficient heat resistance. The results are shown in Tables 1 and 2.

(7) Adhesiveness to Metal Foil (at 25° C. and 125° C.)

The copper foil of the double-sided copper-clad laminate produced from 4 plies of the prepregs was partially etched to form a copper foil line having a width of 3 mm. With a peeling test machine for isothermal analysis (produced by Shimadzu Corporation) set to an environment with a temperature of 25° C. or 125° C., the copper foil line was peeled in a direction of 90° with respect to the adhesive surface at a speed of 50 mm/min, at which the load was measured and designated as an index of the copper foil peeling strength. A specimen having a copper foil peeling strength at 25° C. of 0.80 kN/m or more and a copper foil peeling strength at 125° C. of 0.40 kN/m or more was judged to have sufficient adhesiveness to a metal foil. The results are shown in Tables 1 and 2.

(8) Tackiness 50 plies of the prepregs cut into a 250 mm square shape were laminated and held between mirror plates having a 270 mm square shape. The same mirror plate was laminated on the upper mirror plate to make the total weight of the upper mirror plates of 3 kg. The assembly was packed and sealed in an aluminum moisture proof bag and placed in a thermostat chamber set to 30° C., and the number of days elapsed until the prepregs started to be adhered to each other was measured and designated as an index of the presence of tackiness. The number of days elapsed until the prepregs start to be adhered to each other is preferably 2 days or more. A specimen having an elapsed days of 7 days or more (shown by >7 in the tables) was judged to have sufficiently low tackiness. The low tackiness is preferred since good handleability is obtained, and the prepregs can be stored in a stacked state. The results are shown in Tables 1 and 2.

(9) Crack Resistance (Solder Crack Resistance)

The multilayer board for evaluation was etched to form a circuit, and electrodes for mounting a chip were formed. Thereafter, a solder resist was formed, and a flux was coated as a finishing treatment. Thereafter, a solder paste was coated on the electrodes, a chip resister (3226 size) was mounted on the electrodes, and the board was placed in a reflow furnace to produce a mounted board.

Subsequently, the mounted board was placed in a temperature cycle tester and subjected to a heat cycle test of retaining at −45° C. and 125° C. for 30 minutes respectively in the air (with a temperature increase rate of 10° C./min and a temperature decrease rate of 10° C./min) as one cycle, and every 500 cycles, the mounted board was taken out and visually observed on the cross section thereof for the presence of solder cracks. The evaluation was continued by 4,000 cycles at most, and the number of cycles until solder cracks occurred was measured and designated as an index of the solder crack resistance.

As the judgement standard of the occurrence of cracks, the case where the size of the crack was 50% or more of the length of solder connecting the component was judged as rejected (i.e., solder cracks occurred). The number of cycles is preferably 2,500 or more.

(10) Electric Insulation Reliability

The double-sided copper-clad laminate produced from 4 plies of the prepregs processed to make a test pattern having a distance between the walls of through holes of 350 μm, and the test pattern was measured with time for the insulation resistance of 400 holes, which was designated as an index of the electric insulation reliability. The period of time until insulation breakdown occurred was measured under the measurement condition of an 85° C./85% RH environment under application of 100 V. The measurement time was 2,000 hours at most, and a specimen having a period of time of 2,000 hours or more was judged to have sufficient electric insulation reliability.

TABLE 1

|  |  |  |  | Example ||||||
|---|---|---|---|---|---|---|---|---|
|  |  |  |  | 1 | 2 | 3 | 4 | 5 |
| Thermosetting resin composition (part by mass) | Component (A) | Component (A-1) | (A-1-a) | 8 | 16 | 8 | 16 | 8 |
|  |  |  | (A-1-b) | — | — | — | — | — |
|  |  | Component (A-2) | Cresol novolac type phenol resin | 2 | 4 | 2 | 4 | 2 |
|  | Component (B) |  | Dicyclopentadiene type epoxy resin | 70 | 70 | — | — | — |
|  |  |  | Tetrabromobisphenol A type epoxy resin | — | — | 70 | 70 | — |
|  |  |  | Naphthalene skeleton-containing novolac type epoxy resin | — | — | — | — | 70 |
|  |  |  | Phenol novolac type epoxy resin | — | — | — | — | — |
|  |  |  | Phenol biphenyl aralkyl type epoxy resin | — | — | — | — | — |
|  | Component (C) |  | 2-Methylimidazole | 0.1 | 0.1 | 0.1 | 0.1 | 0.1 |
|  | Component (D) |  | Pulverized silica | 20 | 20 | 20 | 20 | 20 |
|  | Coupling agent |  | A-187 | 0.1 | 0.1 | 0.1 | 0.1 | 0.1 |
| Evaluation result | (1) Varnish property (compatibility of components) |  |  | A | A | A | A | A |
|  | (2) Varnish property (viscosity) (mPa · s) |  |  | 357 | 618 | 225 | 396 | 423 |
|  | (3) Appearance of prepreg |  |  | A | A | A | A | A |
|  | (4) Storage elastic modulus (Pa) |  |  | $3.1 \times 10^9$ | $2.2 \times 10^9$ | $3.3 \times 10^9$ | $2.6 \times 10^9$ | $3.5 \times 10^9$ |
|  | (5) Tensile elongation rate (%) | 25° C. |  | 4.2 | 5.0 | 3.8 | 4.3 | 3.7 |
|  |  | 125° C. |  | 6.9 | 9.4 | 6.3 | 8.6 | 5.7 |
|  | (6) Heat resistance (second) |  |  | >300 | >300 | >300 | >300 | >300 |
|  | (7) Adhesiveness to metal foil (kN/m) | 25° C. |  | 1.11 | 0.91 | 1.17 | 1.03 | 1.18 |
|  |  | 125° C. |  | 0.56 | 0.49 | 0.65 | 0.53 | 0.68 |
|  | (8) Tackiness (day) |  |  | >7 | >7 | >7 | >7 | >7 |
|  | (9) Crack resistance (number of cycles) |  |  | 4,000 | 4,000 | 4,000 | 4,000 | 4,000 |
|  | (10) Electric insulation reliability (hour) |  |  | >2,000 | >2,000 | >2,000 | >2,000 | >2,000 |

|  |  |  |  | Example ||||||
|---|---|---|---|---|---|---|---|---|
|  |  |  |  | 6 | 7 | 8 | 9 | 10 |
| Thermosetting resin composition (part by mass) | Component (A) | Component (A-1) | (A-1-a) | 16 | 8 | 16 | 8 | 16 |
|  |  |  | (A-1-b) | — | — | — | — | — |
|  |  | Component (A-2) | Cresol novolac type phenol resin | 4 | 2 | 4 | 2 | 4 |
|  | Component (B) |  | Dicyclopentadiene type epoxy resin | — | — | — | — | — |
|  |  |  | Tetrabromobisphenol A type epoxy resin | — | — | — | — | — |
|  |  |  | Naphthalene skeleton-containing novolac type epoxy resin | 70 | — | — | — | — |
|  |  |  | Phenol novolac type epoxy resin | — | 70 | 70 | — | — |
|  |  |  | Phenol biphenyl aralkyl type epoxy resin | — | — | — | 70 | 70 |
|  | Component (C) |  | 2-Methylimidazole | 0.1 | 0.1 | 0.1 | 0.1 | 0.1 |
|  | Component (D) |  | Pulverized silica | 20 | 20 | 20 | 20 | 20 |
|  | Coupling agent |  | A-187 | 0.1 | 0.1 | 0.1 | 0.1 | 0.1 |
| Evaluation result | (1) Varnish property (compatibility of components) |  |  | A | A | A | A | A |
|  | (2) Varnish property (viscosity) (mPa · s) |  |  | 539 | 274 | 436 | 242 | 373 |
|  | (3) Appearance of prepreg |  |  | A | A | A | A | A |
|  | (4) Storage elastic modulus (Pa) |  |  | $2.9 \times 10^9$ | $3.3 \times 10^9$ | $2.4 \times 10^9$ | $3.8 \times 10^9$ | $3.1 \times 10^9$ |
|  | (5) Tensile elongation rate (%) | 25° C. |  | 4.2 | 3.9 | 4.5 | 3.7 | 3.8 |
|  |  | 125° C. |  | 6.4 | 6.1 | 6.7 | 5.7 | 6.2 |
|  | (6) Heat resistance (second) |  |  | >300 | >300 | >300 | >300 | >300 |
|  | (7) Adhesiveness to metal foil (kN/m) | 25° C. |  | 1.07 | 1.15 | 0.97 | 1.19 | 1.12 |
|  |  | 125° C. |  | 0.54 | 0.63 | 0.50 | 0.78 | 0.69 |
|  | (8) Tackiness (day) |  |  | >7 | >7 | >7 | >7 | >7 |
|  | (9) Crack resistance (number of cycles) |  |  | 4,000 | 4,000 | 4,000 | 4,000 | 4,000 |
|  | (10) Electric insulation reliability (hour) |  |  | >2,000 | >2,000 | >2,000 | >2,000 | >2,000 |

TABLE 2

| | | | | Example | | | | | |
|---|---|---|---|---|---|---|---|---|---|
| | | | | 11 | 12 | 13 | 14 | 15 | 16 |
| Thermosetting resin composition (part by mass) | Component (A) | Component (A-1) | (A-1-a) | — | — | — | — | — | — |
| | | | (A-1-b) | 16 | 16 | 16 | 16 | 16 | 14 |
| | | Component (A-2) | Cresol novolac type phenol resin | 4 | 4 | 4 | 4 | 4 | 6 |
| | Component (B) | | Dicyclopentadiene type epoxy resin | 70 | — | — | — | — | — |
| | | | Tetrabromobisphenol A type epoxy resin | — | 70 | — | — | — | — |
| | | | Naphthalene skeleton-containing novolac type epoxy resin | — | — | 70 | — | — | — |
| | | | Phenol novolac type epoxy resin | — | — | — | 70 | — | — |
| | | | Phenol biphenyl aralkyl type epoxy resin | — | — | — | — | 70 | 70 |
| | Component (C) | | 2-Methylimidazole | 0.1 | 0.1 | 0.1 | 0.1 | 0.1 | 0.1 |
| | Component (D) | | Pulverized silica | 20 | 20 | 20 | 20 | 20 | 20 |
| | Coupling agent | | A-187 | 0.1 | 0.1 | 0.1 | 0.1 | 0.1 | 0.1 |
| Evaluation result | (1) Varnish property (compatibility of components) | | | A | A | A | A | A | A |
| | (2) Varnish property (viscosity) (mPa · s) | | | 634 | 425 | 578 | 481 | 401 | 388 |
| | (3) Appearance of prepreg | | | A | A | A | A | A | A |
| | (4) Storage elastic modulus (Pa) | | | $2.0 \times 10^9$ | $2.3 \times 10^9$ | $2.4 \times 10^9$ | $2.2 \times 10^9$ | $2.9 \times 10^9$ | $3.5 \times 10^9$ |
| | (5) Tensile elongation rate (%) | 25° C. | | 5.3 | 4.6 | 4.6 | 5.1 | 4.1 | 3.9 |
| | | 125° C. | | 10.1 | 9.1 | 6.7 | 7.3 | 6.9 | 6.6 |
| | (6) Heat resistance (second) | | | >300 | >300 | >300 | >300 | >300 | >300 |
| | (7) Adhesiveness to metal foil (kN/m) | 25° C. | | 0.88 | 0.97 | 1.02 | 0.94 | 1.08 | 1.12 |
| | | 125° C. | | 0.48 | 0.51 | 0.53 | 0.48 | 0.64 | 0.68 |
| | (8) Tackiness (day) | | | >7 | >7 | >7 | >7 | >7 | >7 |
| | (9) Crack resistance (number of cycles) | | | 4,000 | 4,000 | 4,000 | 4,000 | 4,000 | 4,000 |
| | (10) Electric insulation reliability (hour) | | | >2,000 | >2,000 | >2,000 | >2,000 | >2,000 | >2,000 |

| | | | | Example | | Comparative Example | | |
|---|---|---|---|---|---|---|---|---|
| | | | | 17 | 18 | 1 | 2 | 3 |
| Thermosetting resin composition (part by mass) | Component (A) | Component (A-1) | (A-1-a) | 35 | 45 | — | — | — |
| | | | (A-1-b) | — | — | — | — | — |
| | | Component (A-2) | Cresol novolac type phenol resin | 15 | 5 | 20 | 20 | 20 |
| | Component (B) | | Dicyclopentadiene type epoxy resin | — | — | 70 | — | — |
| | | | Tetrabromobisphenol A type epoxy resin | 30 | 30 | — | — | — |
| | | | Naphthalene skeleton-containing novolac type epoxy resin | — | — | — | 70 | — |
| | | | Phenol novolac type epoxy resin | — | — | — | — | — |
| | | | Phenol biphenyl aralkyl type epoxy resin | — | — | — | — | 70 |
| | Component (C) | | 2-Methylimidazole | 0.1 | 0.1 | 0.1 | 0.1 | 0.1 |
| | Component (D) | | Pulverized silica | 20 | 20 | 20 | 20 | 20 |
| | Coupling agent | | A-187 | 0.1 | 0.1 | 0.1 | 0.1 | 0.1 |
| Evaluation result | (1) Varnish property (compatibility of components) | | | A | A | A | A | A |
| | (2) Varnish property (viscosity) (mPa · s) | | | 587 | 751 | 283 | 376 | 184 |
| | (3) Appearance of prepreg | | | A | A | A | A | A |
| | (4) Storage elastic modulus (Pa) | | | $2.0 \times 10^9$ | $1.4 \times 10^9$ | $5.1 \times 10^9$ | $7.5 \times 10^9$ | $8.1 \times 10^9$ |
| | (5) Tensile elongation rate (%) | 25° C. | | 5.9 | 8.3 | 2.1 | 1.3 | 1.1 |
| | | 125° C. | | 10.1 | 13.4 | 3.4 | 1.5 | 1.3 |
| | (6) Heat resistance (second) | | | >300 | >300 | >300 | >300 | >300 |
| | (7) Adhesiveness to metal foil (kN/m) | 25° C. | | 0.89 | 0.83 | 1.01 | 1.23 | 1.25 |
| | | 125° C. | | 0.46 | 0.42 | 0.79 | 0.91 | 1.04 |
| | (8) Tackiness (day) | | | 4 | 2 | >7 | >7 | >7 |
| | (9) Crack resistance (number of cycles) | | | 4,000 | 4,000 | 2,000 | 1,500 | 1,500 |
| | (10) Electric insulation reliability (hour) | | | >2,000 | >2,000 | >2,000 | >2,000 | >2,000 |

As apparent from Tables 1 and 2, Examples have low elasticity, high heat resistance, high elongation, high electric insulation reliability, and high adhesion strength to a metal foil, also have low tackiness and suffer no solder crack, and thus exhibit excellent characteristics in all the properties. Furthermore, the resin compositions (varnishes) prepared in Examples have good varnish property and are good in appearance of the prepreg.

It is understood that Examples 1 to 16 having a content of the phenol-based resin (A-1) in a range of 0.1 to 40 parts by mass per 100 parts by mass of the total resin content are further excellent in low tackiness.

On the other hand, Comparative Examples 1 to 3 using the thermosetting resin composition containing no phenol-based resin (A-1) fail to satisfy all low elasticity, high heat resistance, high elongation, high electric insulation reliability, high adhesion strength to a metal foil, and solder crack resistance, and particularly, low elasticity, high elongation, and solder crack resistance are significantly short although high adhesion strength to a metal foil is achieved.

The invention claimed is:

1. A thermosetting resin composition comprising (A) a phenol-based resin and (B) a thermosetting resin,
the component (A) containing (A-1) a phenol-based resin having an aliphatic hydrocarbon group having 10 to 25 carbon atoms, having a weight average molecular weight (Mw) of 1,412 to 1,738, and having a hydroxy group equivalent of 214 to 238 g/eq, and (A-2) a phenol-based resin that does not have an aliphatic hydrocarbon group having 10 to 25 carbon atoms and having a hydroxy group equivalent of 80 to 150 g/eq, wherein:
the component (A-1) has at least one kind of a structural unit selected from the group consisting of a structural unit (a1) represented by the following general formula (a1) and a structural unit (a2) represented by the following general formula (a2):

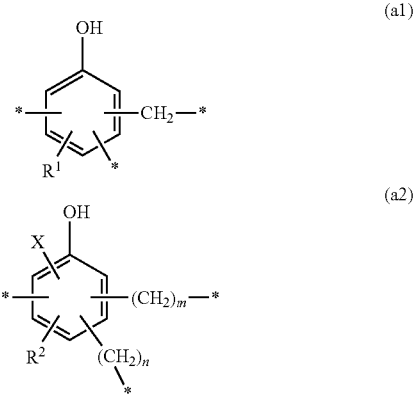

wherein $R^1$ represents a hydrogen atom, an aliphatic hydrocarbon group having 1 to 9 carbon atoms, which optionally have a substituent, an aromatic hydrocarbon group having 5 to 15 ring atoms, which optionally have a substituent, or a combination of the aliphatic hydrocarbon group and the aromatic hydrocarbon group; $R^2$ represents an aliphatic hydrocarbon group having 10 to 25 carbon atoms; X represents a hydrogen atom, a hydroxy group, or a hydroxymethyl group; and m and n each independently represent 0 or 1;
the component (A-2) comprises a cresol novolac phenol resin;
the component (B) comprises at least one thermosetting resin selected from the group consisting of a dicyclopentadiene epoxy resin, a tetrabromobisphenol A epoxy resin, a naphthalene skeleton-containing novolac epoxy resin, a phenol novolac epoxy resin, and a phenol biphenyl aralkyl epoxy resin, wherein a content of the component (B) is 60 to 90 parts by mass per 100 parts by mass of the total resin content of the thermosetting resin composition;
the thermosetting resin composition further comprises a curing accelerator (C) in an amount of 0.01 to 10 parts by mass per 100 parts by mass of the total resin content of the thermosetting resin composition, a filler (D) in an amount of 5 to 40 parts by mass per 100 parts by mass of the total resin content of the thermosetting resin composition, and a coupling agent in an amount of 0.01 to 20 parts by mass per 100 parts by mass of the total resin content of the thermosetting resin composition; and
a content of the component (A-1) is from 10 to 18 parts by mass per 100 parts by mass of the total resin content of the thermosetting resin composition and a content ratio of the component (A-1) is from 30 to 95% by mass based on the total amount of the component (A-1) and the component (A-2).

2. The thermosetting resin composition according to claim 1, wherein a molar ratio of the structural unit (a1) with respect to the structural unit (a2) (structural unit (a1)/structural unit (a2)) is from 0 to 5.0.

3. The thermosetting resin composition according to claim 1, wherein a content of the component (B) is 60 to 80 parts by mass per 100 parts by mass of the total resin content of the thermosetting resin composition.

4. A prepreg comprising the thermosetting resin composition according to claim 1.

5. A laminate comprising the prepreg according to claim 4.

6. A printed wiring board comprising the laminate according to claim 5.

7. A semiconductor package comprising the printed wiring board according to claim 6.

8. A metal foil with a resin comprising the thermosetting resin composition according to claim 1 and a metal foil laminated on each other.

9. A laminate comprising the metal foil with a resin according to claim 8.

* * * * *